(12) United States Patent
Tropp et al.

(10) Patent No.: US 8,193,811 B2
(45) Date of Patent: Jun. 5, 2012

(54) DUAL-FREQUENCY COIL ARRAY FOR A MAGNETIC RESONANCE IMAGING (MRI) SYSTEM

(75) Inventors: James S. Tropp, Berkely, CA (US); Paul Calderon, Castro Valley, CA (US); Fraser Robb, Aurora, OH (US); Donald McCune, N. Canton, OH (US); Thomas Grafendorfer, Menlo Park, CA (US); Keerthi Shet, Sunnyvale, CA (US)

(73) Assignee: General Electric Company, Schenectady, NY (US)

( * ) Notice: Subject to any disclaimer, the term of this patent is extended or adjusted under 35 U.S.C. 154(b) by 326 days.

(21) Appl. No.: 12/475,068

(22) Filed: May 29, 2009

(65) Prior Publication Data

US 2010/0301862 A1 Dec. 2, 2010

(51) Int. Cl.
*G01V 3/00* (2006.01)

(52) U.S. Cl. .................................. 324/318

(58) Field of Classification Search .......... 324/300–322; 600/410–435; 333/219–235; 343/701, 728, 343/741–748, 826, 850–867, 893
See application file for complete search history.

(56) References Cited

U.S. PATENT DOCUMENTS

| | | | |
|---|---|---|---|
| 4,799,016 A | | 1/1989 | Rezvani |
| 4,899,109 A | * | 2/1990 | Tropp et al. ............ 324/320 |
| 5,144,240 A | * | 9/1992 | Mehdizadeh et al. ........ 324/318 |
| 5,168,230 A | | 12/1992 | Hashoian et al. |
| 5,317,266 A | * | 5/1994 | Meissner ............... 324/318 |
| 6,177,797 B1 | * | 1/2001 | Srinivasan ............... 324/318 |
| 6,348,794 B1 | * | 2/2002 | Nabetani et al. ......... 324/318 |
| 6,847,210 B1 | * | 1/2005 | Eydelman et al. ......... 324/318 |
| 7,012,429 B1 | * | 3/2006 | Ledden ................. 324/318 |
| 7,123,012 B2 | * | 10/2006 | Srinivasan ............... 324/318 |
| 7,573,432 B1 | * | 8/2009 | Eydelman et al. ......... 343/792 |

OTHER PUBLICATIONS

Thomas M. Grist et al., Doubly Tuned Local Coils for MRI and MRS at 1.5 T*, Magnetic Resonance in Medicine 6, 253-264 (1988).
J.R. Fitzsimmons et al., A Comparison of Double-Tuned Surface Coils, Magnetic Resonance in Medicine 10, 302-309 (1989).
Jeffrey R. Fitzsimmons et al., A Transformer-Coupled Double-Resonant Probe for NMR Imaging and Spectroscopy, Magnetic Resonance in Medicine 5, 471-477 (1987).
M. Alecci et al., Practical Design of a 4 Tesla Double-Tuned RF Surface Coil for Interleaved 1H and 23Na MRI of Rat Brain, Journal of Magnetic Resonance 181 (2006) 203-211.
Boguslaw Tomanek et al., Dual Surface Coil With High-B1 Homogeneity for Deep Organ MR Imaging, Magnetic Resonance Imaging, vol. 15, No. 10, pp. 1199-1204, 1997.
P.B. Roemer et al., The NMR Phased Array, Magnetic Resonance in Medicine 16, 192-225 (1990).

* cited by examiner

*Primary Examiner* — Dixomara Vargas
(74) *Attorney, Agent, or Firm* — The Small Patent Law Group; Dean D. Small (57) ABSTRACT

A dual-frequency coil array for a magnetic resonance imaging (MRI) system is provided. The coil array includes a first coil element having a pair of dual-frequency loop coils and a second coil element having a pair of dual-frequency loop coils. The coil array further includes at least one capacitive mesh configured to decouple the pairs of dual-frequency loop coils of the first and second coil elements.

15 Claims, 7 Drawing Sheets

DUAL-FREQUENCY COIL ARRAY FOR A MAGNETIC RESONANCE IMAGING (MRI) SYSTEM

BACKGROUND OF THE INVENTION

The subject matter disclosed herein relates generally to antenna arrays, and more particularly to a dual-frequency coil array for a Magnetic Resonance Imaging (MRI) system.

MRI systems include a magnet, such as a superconducting magnet that generates a temporally constant (i.e., uniform and static) primary or main magnetic field. MRI data acquisition is accomplished by exciting magnetic moments within the primary magnetic field using magnetic gradient coils. For example, in order to image a region of interest, the magnetic gradient coils are energized to impose a magnetic gradient to the primary magnetic field. Transmit radio-frequency (RF) coils are then pulsed to create RF magnetic field pulses in a bore of an MRI scanner to selectively excite a volume corresponding to the region of interest in order to acquire MR images of the region of interest using receive RF coils. The resultant image that is generated shows the structure and function of the region of interest.

In these MRI systems, the RF coils (essentially near field antennas) are current loops that are tuned to resonate at a desired Larmor frequency for particular nuclear species. While most MRI scanners operate primarily at the frequency of the common hydrogen nucleus, other frequencies are possible, for the observation of other nuclei, such as $^{13}C$, the magnetic nuclide of carbon. For dual (or multi) frequency MRI systems, doubly (or double) resonant tuning of the antennas is often needed to facilitate operation at both frequencies in a single exam. This doubly resonant tuning may be provided with the dual resonance of a single RF coil or with two separate coils each individually tuned and that typically include geometric and/or circuit-trap decoupling. Electromagnetic decoupling of individual RF coil elements is needed to minimize crosstalk between channels of the MRI system.

BRIEF DESCRIPTION OF THE INVENTION

In accordance with one embodiment, a radio-frequency (RF) coil array for magnetic resonance imaging is provided. The RF coil array includes a first coil element having a pair of dual-frequency loop coils and a second coil element having a pair of dual-frequency loop coils. The RF coil array further includes at least one capacitive mesh configured to decouple the pairs of dual-frequency loop coils of the first and second coil elements.

In accordance with another embodiment, a radio-frequency (RF) coil array arrangement for magnetic resonance imaging is provided. The RF coil array arrangement includes an RF receive array of dual-frequency coil elements and an RF transmit coil array.

In accordance with yet another embodiment, a method of providing dual-frequency magnetic resonance imaging includes tuning a plurality of pairs of radio-frequency (RF) loop coils to resonate at different frequencies. The pairs of RF loop coils form an RF coil array. The method further includes decoupling the RF loop coils using capacitive meshes.

DETAILED DESCRIPTION OF THE INVENTION

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or random access memory, hard disk, or the like). Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide an array of dual-frequency or doubly-tuned radio-frequency (RF) coils for Magnetic Resonance Imaging (MRI) systems. The dual-frequency RF coils is some embodiments include concentric coil elements that are tuned to resonant at different frequencies, for example, one resonant for carbon and one resonant for proton, namely to resonate at the Larmor frequencies of carbon and proton to induce Larmor precession in the carbon (e.g., $^{13}C$ nuclei) atoms and protons (hydrogen nuclei). It should be noted that MRI systems as used herein does not exclude systems also concurrently having the capability to perform Magnetic Resonance Spectroscopy (MRS) and the various embodiments described herein for the use in an MRI procedure are also applicable to MRS.

Figure 1:
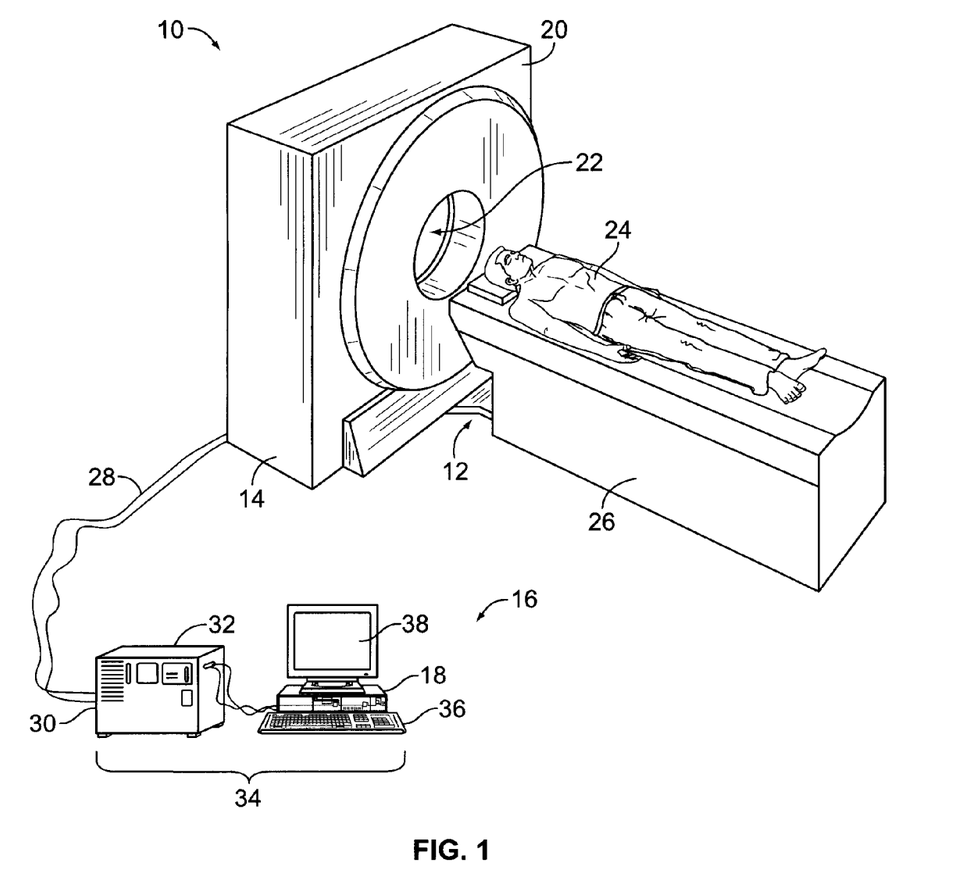
FIG. 1 is a pictorial view of an imaging system formed in accordance with various embodiments.

Various embodiments of a dual-frequency RF coil array may be provided as part of an imaging system 10 as shown in FIG. 1. It should be appreciated that although the imaging system 10 is illustrated as a single modality imaging system, the various embodiments may be implemented in or with multi-modality imaging systems. The imaging system 10 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 1, the imaging system 10 includes an imaging portion 12 having an imaging unit 14 (e.g., imaging scanner) and a processing portion 16 that may include a processor 18 or other computing or controller device. In particular, the imaging unit 14 enables the imaging system 10 to scan an object or patient 24 to acquire image data, which may be image data of all or a portion of the object or patient 24. The imaging unit 14 includes a gantry 20 having one or more imaging components (e.g., magnets or magnet windings within the gantry 20) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 16 via a communication link 28 that may be wired or wireless. It should be noted that the signals may be configured in different protocols, etc. It should also be noted that during an imaging scan by the imaging unit 14, the gantry 20 and the imaging components mounted thereon or therein may remain stationary or rotate about or along a center of rotation defining an examination axis through a bore 22. The patient 24 may be positioned within the gantry 20 using, for example, a motorized table 26.

In operation an output of one or more of the imaging components is transmitted to the processing portion 16, and vice versa, which may include transmitting signals to or from the processor 18 through a control interface 30. The processor 18 also may generate control signals for controlling the position of the motorized table 26 or imaging components based on user inputs or a predetermined scan. During a scan, image data, such as magnetic resonance image data from the imaging components may be communicated to the processor 18 through a data interface 32 via the control interface 30. The processor 18 and associated hardware and software used to acquire and process data may be collectively referred to as a workstation 34. The workstation 34 includes a keyboard 36 and/or other input devices such as a mouse, a pointer, and the like, and a monitor 38. The monitor 38 displays image data and may accept input from a user if a touchscreen is available.

Figure 2:
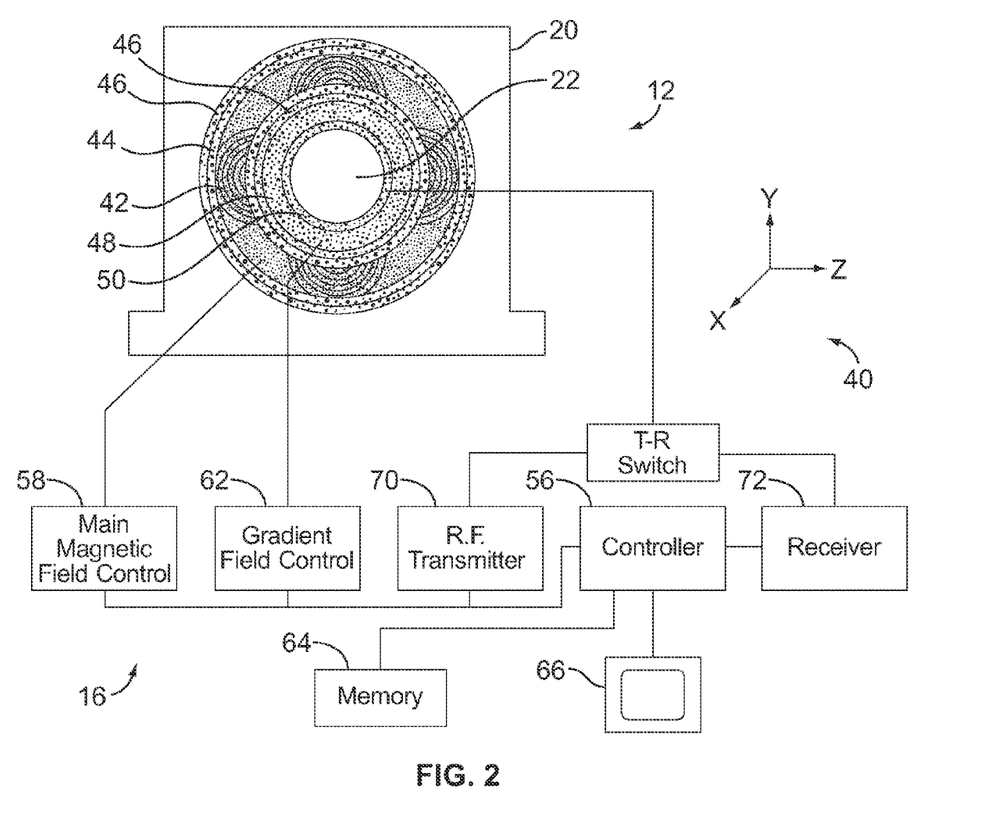
FIG. 2 is a block diagram of a magnetic resonance imaging (MRI) system formed in accordance with various embodiments.

For illustrative purposes only, various embodiments may be implemented as an MRI system 40 as shown in FIG. 2. In particular, the MRI system 40 includes within the gantry 20 a superconducting magnet 42 formed from magnetic coils supported on a magnet coil support structure. However, in other embodiments, different types of magnets may be used, such as permanent magnets or electromagnets. A vessel 44 surrounds the superconducting magnet 42 and is filled with liquid helium to cool the coils of the superconducting magnet 42. The liquid filled vessel 44 is also referred to as a cryostat. Thermal insulation 46 is provided surrounding the outer surface of the vessel 44 and the inner surface of the superconducting magnet 42. A plurality of magnetic gradient coils 48 are provided within the superconducting magnet 42 and a Radio-Frequency (RF) transmit coil 50 is provided within the plurality of magnetic gradient coils 48. In some embodiments the transmit coil 50 may be replaced with a transmit and receive coil as described in more detail herein. The components within the gantry 20 generally form the imaging portion 12. It should be noted that although the superconducting magnet 42 is a cylindrical shaped, other shapes of magnets can be used.

The processing portion 16 generally includes a controller 56, a main magnetic field control 58, a gradient field control 62, a memory 64, a display device 66, a transmit-receive (T-R) switch 68, a radio frequency (RF) transmitter 70 and a receiver 72.

Figure 3:
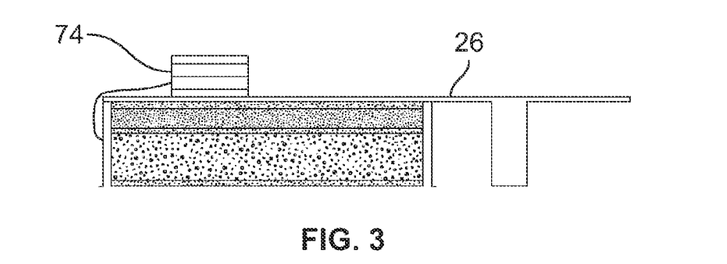
FIG. 3 is a side elevation view of a patient table and body part specific receive coil that may be used with the MRI system of FIG. 2.

In operation, a body of an object, such as the patient 24 (shown in FIG. 1) or a phantom to be imaged, is placed in the bore 22 on a suitable support, for example, the motorized table 26 (shown in FIGS. 1 and 3) or other patient table. The superconducting magnet 42 produces a uniform and static main magnetic field $B_o$ across the bore 22. The strength of the electromagnetic field in the bore 22 and correspondingly in the patient 24, is controlled by the controller 56 via the main magnetic field control 58, which also controls a supply of energizing current to the superconducting magnet 42.

The magnetic gradient coils 48, which include one or more gradient coil elements, are provided so that a magnetic gradient can be imposed on the magnetic field $B_o$ in the bore 22 within the superconducting magnet 42 in any one or more of three orthogonal directions x, y, and z. The magnetic gradient coils 48 are energized by the gradient field control 62 and are also controlled by the controller 56.

The RF transmit coil 50, which may include a plurality of coils (e.g., resonant surface coils), is arranged to transmit magnetic pulses and/or optionally simultaneously detect MR signals from the patient 24 if receive coil elements are also provided. In various embodiments, a separate RF receive coil 74 (illustrated in FIG. 3 as a body part specific receive coil 74, for example, a torso coil array) may be provided. The RF receive coil 74 in the various embodiments is an array of dual-frequency RF coils that are decoupled using a capacitive mesh as described in mode detail herein. In some other embodiments, the RF transmit coil 50 is also a body part specific coil, which may be combined with the RF receive coil 74.

The RF transmit coil 50 and the RF receive coil 74 are selectably interconnected to one of the RF transmitter 70 or receiver 72, respectively, by the T-R switch 68. The RF transmitter 70 and T-R switch 68 are controlled by the controller 56 such that RF field pulses or signals are generated by the RF transmitter 70 and selectively applied to the patient 24 for excitation of magnetic resonance in the patient 24. While the RF excitation pulses are being applied to the patient 24, the T-R switch 68 is also actuated to decouple the receiver 72 from the RF receive coil 74.

Following application of the RF pulses, the T-R switch 68 is again actuated to decouple the RF transmit coil 50 from the RF transmitter 70 and to couple the RF receive coil 74 to the receiver 72. The RF receive coil 74 includes an array of dual-frequency RF coil elements that operate to detect or sense the MR signals resulting from the excited nuclei in the patient 24 and communicates the MR signals to the receiver 72. These detected MR signals are in turn communicated to the controller 56. The controller 56 includes a processor (e.g., image reconstruction processor), for example, the processor 18 (shown in FIG. 1), that controls the processing of the MR signals to produce signals representative of an image of the patient 24.

The processed signals representative of the image are also transmitted to the display device 66 to provide a visual display of the image. Specifically, the MR signals fill or form a k-space that is Fourier transformed to obtain a viewable image. The processed signals representative of the image are then transmitted to the display device 66.

In operation, the magnetic field $B_o$ generated by the superconducting magnet 42 is applied to the patient 24 that lies along a z-axis of a Cartesian coordinate system, the origin of which is within the patient 24. The uniform magnetic field $B_o$ being applied has the effect of aligning nuclear spins, a quantum mechanical property of nuclei within the patient 24, along the y-axis. In response to the RF pulses of a proper resonant frequency being generated by the RF transmitter 70, and that are orientated within an x-z plane perpendicular to the y-axis, the nuclei resonate at their Larmor frequencies. In a typical imaging sequence, an RF pulse centered about the Larmor frequency is applied to the patient 24 at the same time a magnetic field gradient Gz is being applied along the z-axis by means of the magnetic gradient coils 48. The gradient Gz causes nuclei in a slice with a limited width through the patient 24 along the x-y plane, to have a resonant frequency and to be excited into resonance. In various embodiments, the RF transmitter 70 is configured to generate at least two resonate frequencies, for example, centered about the Larmor frequencies of carbon (e.g., $^{13}C$ nuclei) and proton (hydrogen nuclei). However, it should be noted that the RF transmitter 70 may be configured to generate other frequencies causing different nuclei to resonate at their Larmor frequencies.

After excitation of the nuclei in the slice, magnetic field gradients Gx and Gy are applied along the x and y axes respectively. The magnetic field gradient Gx along the x-axis causes the nuclei to precess at different frequencies depending on the position of the nuclei along the x-axis. Essentially, Gx spatially encodes the precessing nuclei by frequency, referred to as frequency encoding. A y-axis gradient Gy is incremented through a series of values and encodes a y-axis rate of change of phase of the precessing nuclei as a function of the amplitude of the gradient Gy, in a process referred to as phase encoding.

It should again be noted that the various embodiments are not limited to use in connection with the MRI system 40 described herein, but may be implemented in connection with any type of system capable of acquiring MR images and/or spectra, particularly diagnostic images of a patient.

Figure 4:
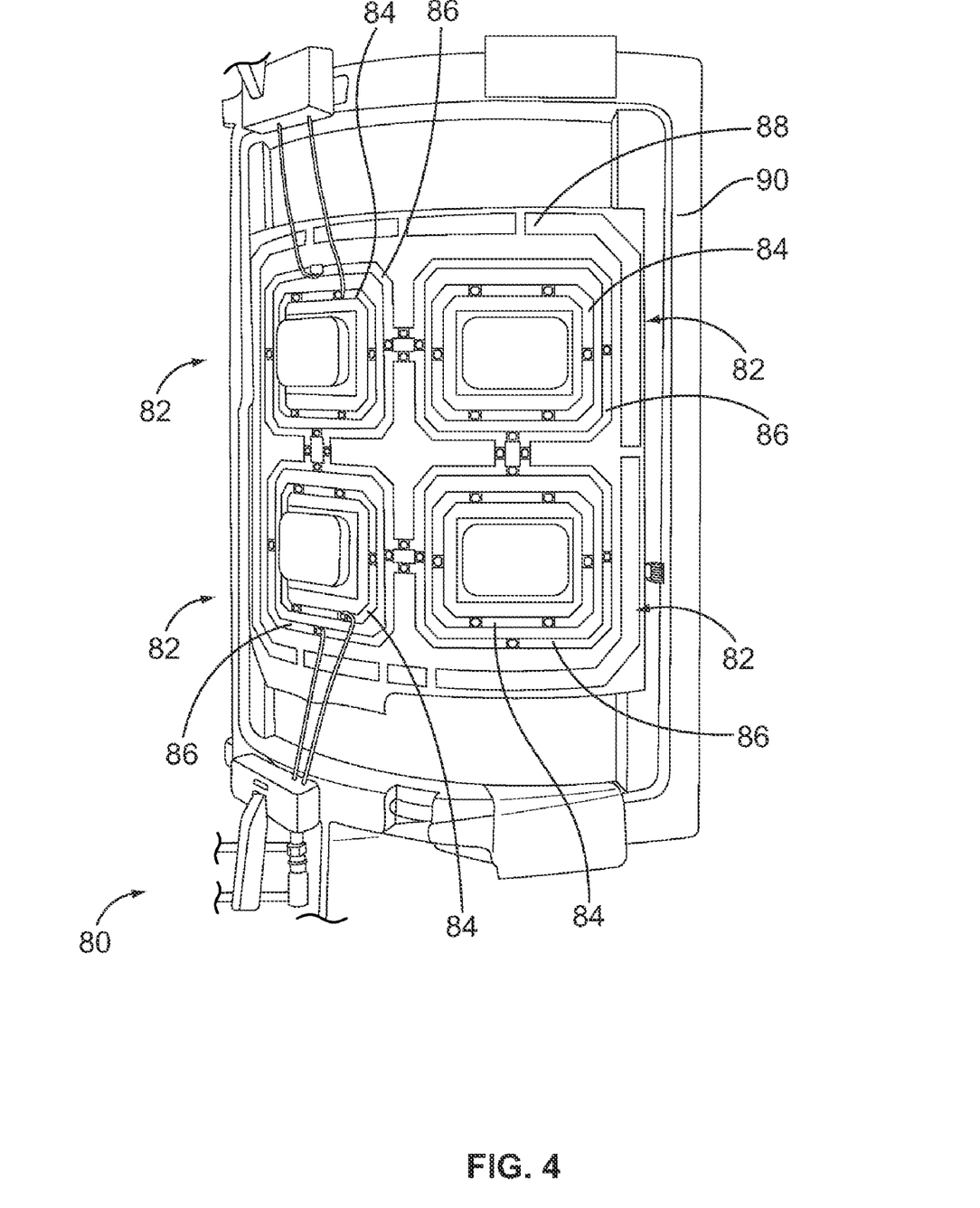
FIG. 4 is a perspective view of a dual-frequency radio-frequency (RF) coil array formed in accordance with various embodiments.

Various embodiments provide a dual-frequency RF coil array 80 as shown in FIG. 4 and illustrated within a torso former 90 for imaging a torso of a patient. However, it should be noted that the number and arrangement of the coil elements may be varied and the dual-frequency RF coil array 80 may provided for imaging different body parts or objects. Moreover, the dual-frequency RF coil array 80 is illustrated as an anterior torso array, but a posterior torso array that may have the same number or a different number of coil elements also may be provided. Additionally, the RF coil array 80 is configured in the following described embodiments as a receive only coil array. However, the RF coil array 80 also may be configured as a transmit and receive coil array.

The RF coil array 80 includes a plurality of coil elements 82. Four coil elements 82 are illustrated in FIG. 4. Each coil element 82 is formed from a concentric pair of loop coils, namely an inner loop coil 84 and an outer loop coil 86. In various embodiments, each of the coil elements 82 is a dual-frequency or doubly-tuned radio-frequency (RF) coil element. For example, in various embodiments the inner loop coil 84 is tuned to be resonant for carbon (e.g., $^{13}C$ nuclei) and the outer loop coil 86 is tuned to be resonant for proton (hydrogen nuclei) defining a carbon-proton coil pair. However, in other embodiments, the inner loop coil 84 is tuned to be resonant for proton and the outer loop coil 86 is tuned to be resonant for carbon. It should be noted that the tuning of the inner loop coil 84 and the outer loop coil 86 may be provided using any known method. Additionally, the inner loop coil 84 and the outer loop coil 86 may be tuned to be resonant for different nuclei other than carbon and proton. The RF coil array 80 also may include a single coil loop 88 surrounding all the coil elements 82.

It should be noted that as used herein, the term "element" refers generally to a grouping of one or more tuned RF coils, which grouping may be repeated or tiled in one or more geometric patterns to produce an array comprising the totality of elements. That is, an element comprises coils and an (RF coil) array comprises elements.

The RF coil array 80 accordingly may be used to enable metabolic imaging of a human torso with hyperpolarized $^{13}C$, for example, carbon in metabolites such as pyruvate. For example, the RF coil array 80 may be used as an adjunct to a prostate exam to search for metastases. However, the RF coil array 80 also allows for conventional torso imaging of protons in the same examination. Thus, the RF coil array 80 may provide imaging based on a combination of conventional MRI of protons with any $^{13}C$ protocol.

The various embodiments also provide decoupling, and in particular, a capacitive mesh decoupling arrangement wherein none of the coil elements 82 are overlapped. However, it should be noted that some of the coil elements 82 may be overlapped and others decoupled with the capacitive mesh. For example, in a four coil element 82 configuration, all four coil elements 82 may be non-overlapping with capacitive mesh decoupling provided therebetween or two of the coil elements 82 may be overlapped and the other two coil elements 82 decoupled with a capacitive mesh. However, it should be noted that in the various embodiments, one or more capacitive meshes may be provided to decouple pairs of dual-frequency coils. The capacitive meshes may be provided between coils in an element or between elements in an array, in which case the capacitive meshes may operate severally among different coils situated in different elements.

Figure 5:
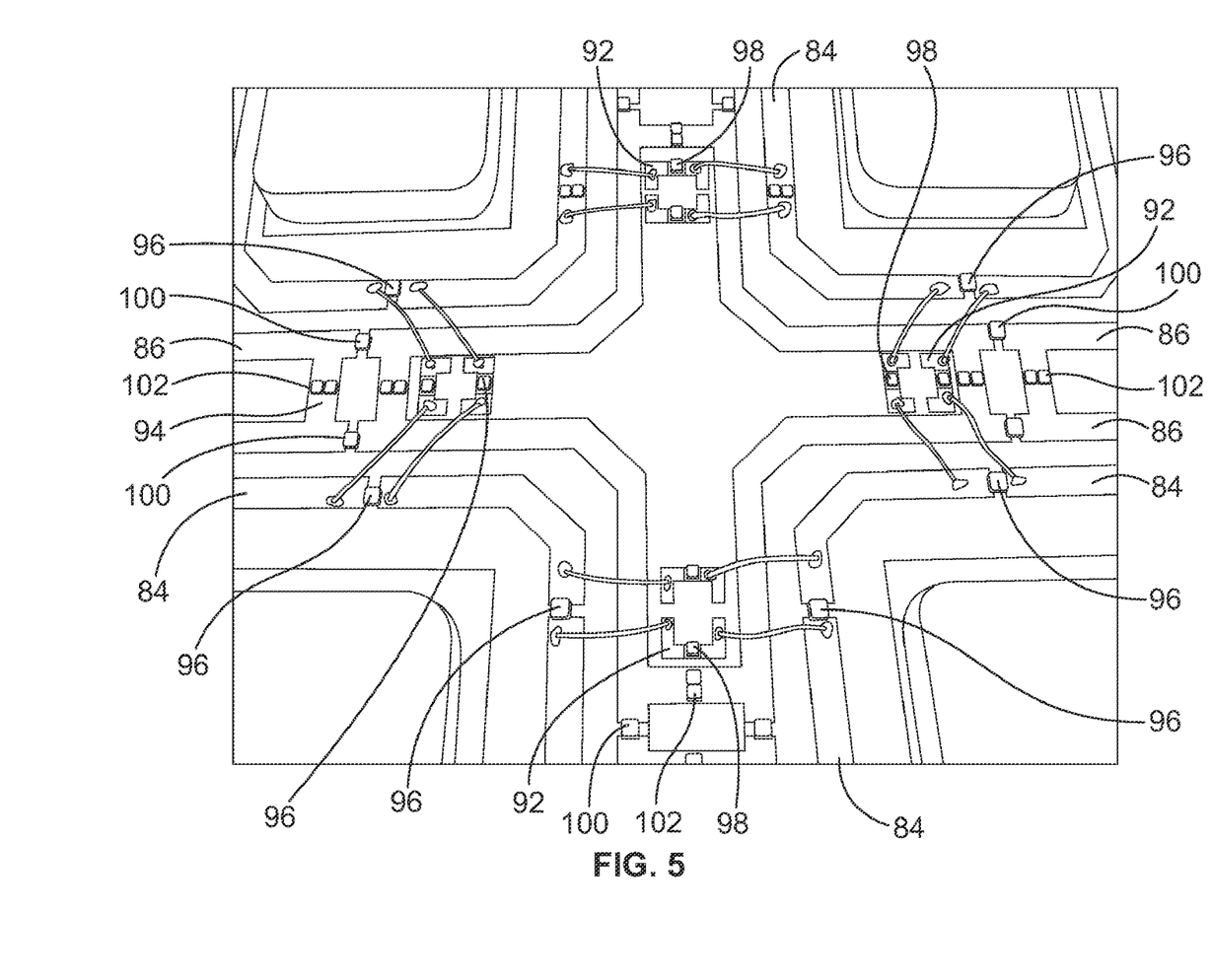
FIG. 5 is a top plan view of a portion of a dual-frequency RF coil array including capacitive mesh decoupling in accordance with various embodiments.

Specifically, in various embodiments, decoupling is provided between inner loop coils 84 in adjacent coil elements 82 and between outer loop coils 86 in adjacent coil elements 82. In particular, a capacitive mesh 92 is provided between inner loop coils 84 in adjacent coil elements 82 and a capacitive mesh 94 is provided between outer loop coils 86 in adjacent coil elements 82 as shown in FIG. 5.

Each of the capacitive meshes 92 and 94 in various embodiments are formed from a four capacitor decoupling configuration. Specifically, the capacitive mesh 92 includes a capacitor 96 on each inner loop coil 84 of adjacent coil elements 82. A pair of capacitors 98 are also connected between the capacitors 96, in particular one capacitor 98 between each side of the opposing capacitors 96. As illustrated, the capacitors 96 and 98 are arranged in a square configuration to define the capacitive mesh 92. The capacitive meshes 92 and 94 accordingly may be formed as interconnected capacitive bridges.

The capacitive mesh 94 is formed in a similar manner. In particular, capacitors 100 are provided on each outer loop coil 86 of adjacent coil elements 82 with capacitors 102 provided therebetween, for example, on traces formed between the outer loop coils 86 of adjacent coil elements 82. The capacitive meshes 92 and 94 provide decoupling of the inner loop coils 84 of adjacent coil elements 82 and the outer loop coils 86 of adjacent coil elements. The size of each of the capacitors 96, 98, 100 and 102 may be determined based on the decoupling requirements of the various loops.

Figure 6:
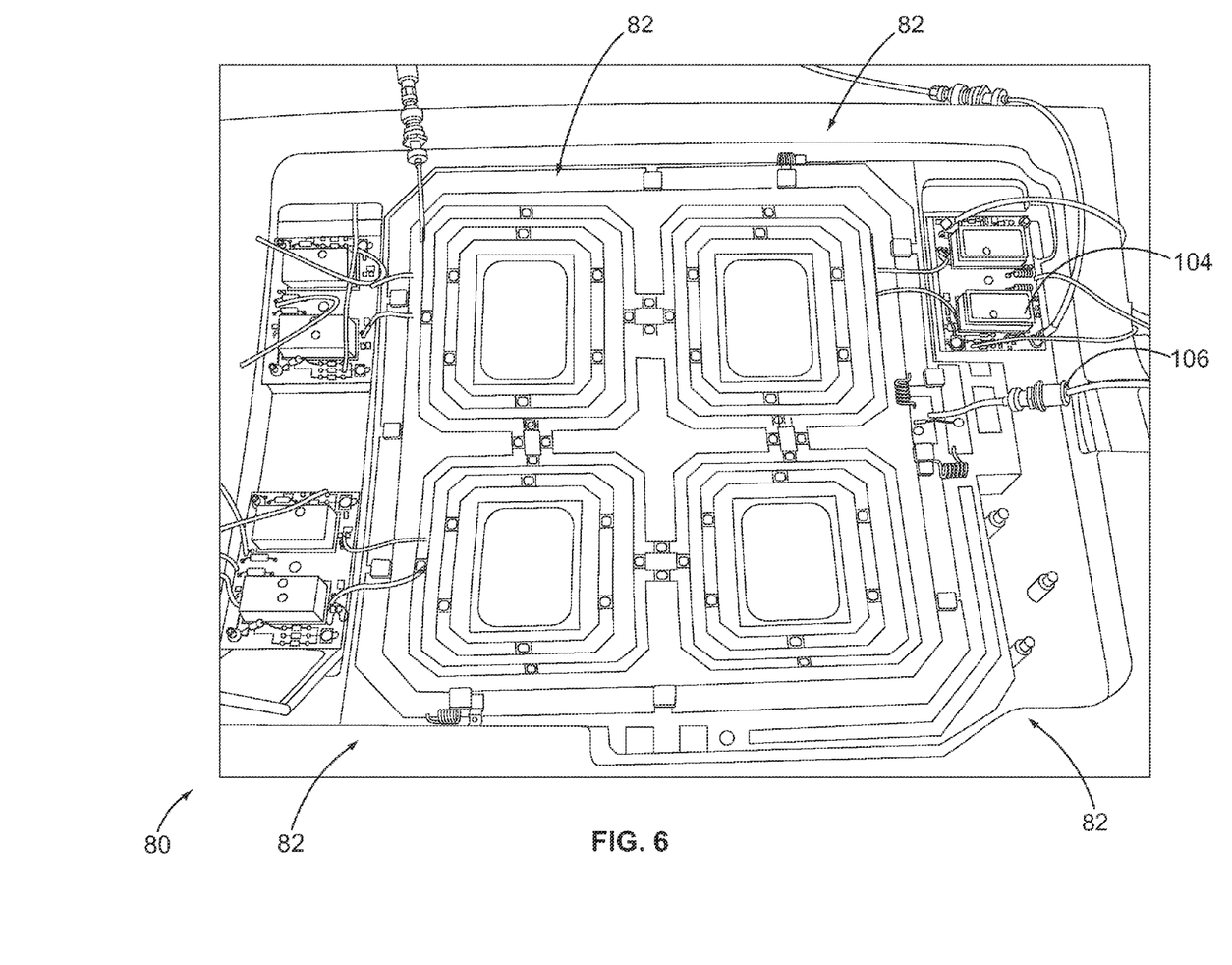
FIG. 6 is a top perspective view of a torso array formed in accordance with various embodiments.

Thus, in various embodiments, adjacent coil elements 82 are not overlapped. Capacitive mesh decoupling interconnects adjacent coil elements 82, and in particular, interconnects the inner loop coils 84 of adjacent coil elements 82 and the outer loop coils 86 of adjacent coil elements 82. In addition to the capacitive mesh decoupling, onboard preamplifiers are provided as shown in FIG. 6. Specifically, one or more preamplifiers 104 may be attached to one of the loop coils 84 or 86. In particular, the preamplifier 104 may be connected to one of the loop coils, such as the inner loop coil 84 of one of the coil elements 82 that is the driven coil, namely the loop coil that is the pickup coil for excitation or to a remote coil that is the pickup coil for excitation (which is illustrated in FIG. 6). The preamplifier 104 may be provided and configured in any known manner and is DC biased. Additionally, other DC bias may be provided, for example, a DC bias line 106 for biasing a blocking diode as is known.

It should be noted that an impedance inverter may be provided in combination with the preamplifier 104. For example, an impedance inversion network may be connected to the preamplifier 104 to effectively operate as a quarter wave cable.

Figure 7:
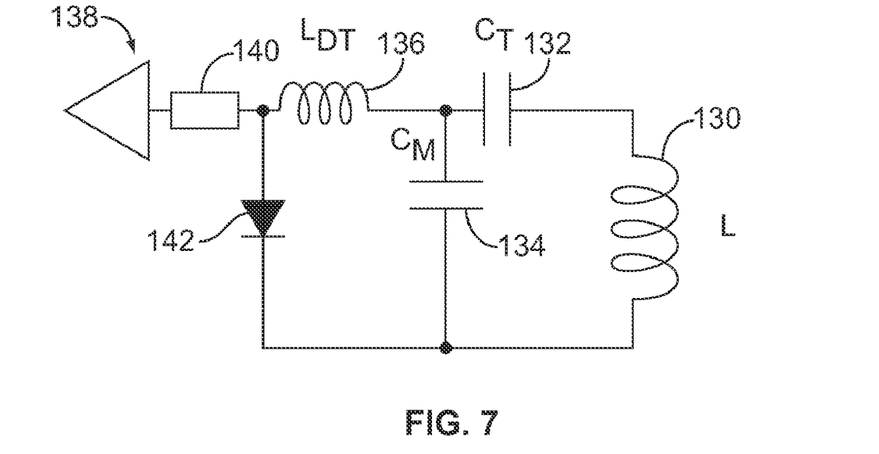
FIG. 7 is a schematic diagram of a preamplifier decoupling arrangement formed in accordance with various embodiments.

Additionally, preamplifier decoupling may be provided as shown in FIG. 7. For example, as illustrated in FIG. 7 a parallel LC trap may be formed in combination with a preamplifier, wherein the input of the preamplifier in various embodiments provides a small impedance, such as two or three ohms. In the illustrated embodiment, a loop coil 130, for example, one of the coils of the coil elements 82 (shown in FIG. 4) may include a first capacitor 132 (e.g., 10 pico-Farad capacitor) for tuning the loop coil 130 and a second capacitor 134 (e.g., 100 pico-Farad capacitor), shunted to ground, and providing impedance matching for the loop coil 130, as is known in the art. The second capacitor 134 is connected in series to an inductor 136 that is connected in series, through a compensation network 140, which with the inductor 136 and second capacitor 134 forms an impedance inverter. The impedance inverter inverts the low input impedance from a preamplifier 138, which has a low resistance to ground (e.g., 2 ohm resistance), to produce a high impedance in the junction bridged by the second capacitor 134 to block any circulating current in the resonant loop formed by the inductor 136, first capacitor 132 and second capacitor 134.

The compensation network 140 may include, for example, a length of cable along with capacitors and inductors to generate impedance at the preamplifier 138 (to provide impedance transformation). A diode 142 is connected between the inductor 136 and the compensation network 140. The diode 142 operates to protect the preamplifier 138 from damage during the transmit cycle, in which a transmission field is applied by a separate resonator, external to the circuitry illustrated in FIG. 7, as is known in the art. The diode 142 also performs the function of minimizing circulating current in the loop coil 130 during transmission, thereby protecting the person (e.g., patient) to be imaged from the possibility of an RF burn. Accordingly, the LC trap arrangement results in the inductor 136 effectively being in parallel with the second capacitor 134 and provides further decoupling of adjacent and remote coils, also referred to as "preamp decoupling" as shown in FIG. 7.

Figure 8:
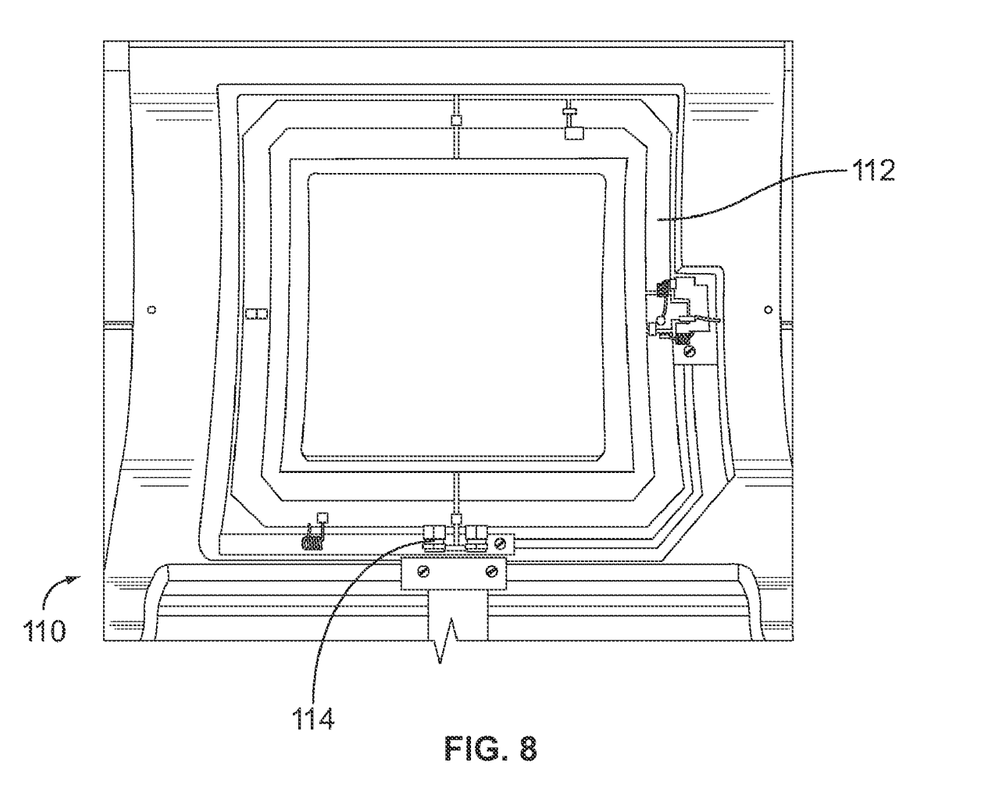
FIG. 8 is a top plan view of an RF transmit coil array formed in accordance with various embodiments.
Figure 9:
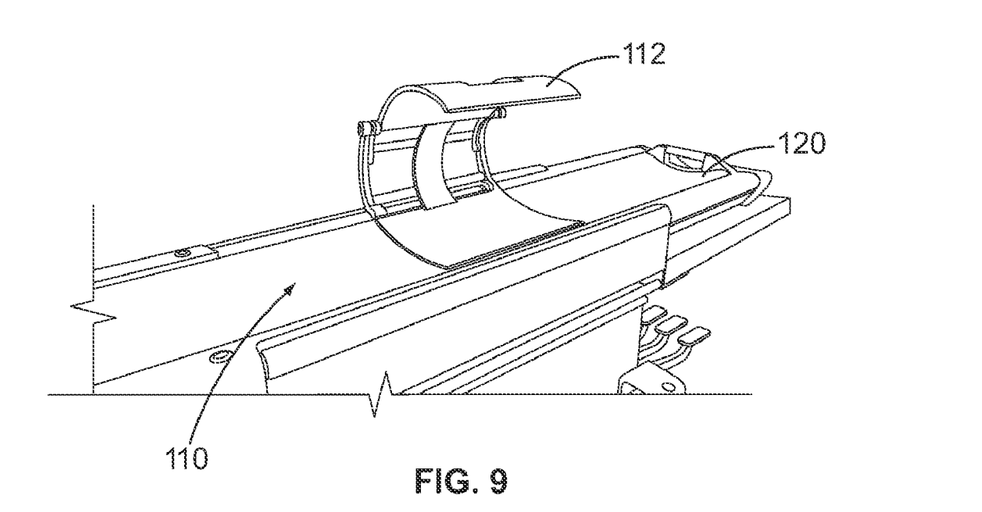
FIG. 9 is a perspective view of a patient table having an RF transmit coil array formed in accordance with various embodiments.

The various embodiments also may provide a transmit coil arrangement in combination with the RF coil array 80, which has been illustrated as a receive only coil array. The transmit coil arrangement 110 shown in FIG. 8 may be combined with the RF coil array 80 to form a transmit and receive coil arrangement. The transmit coil arrangement 110 in various embodiments is a capacitively linked Helmholtz coil pair with one of the loop coils 112 shown in FIG. 8. A similar loop coil 112 (e.g., identical circular magnetic coil) is positioned symmetrically on an opposite side of the imaging area along a common axis, for example, on opposite sides of a gantry bore. The loop coils 112 may be generally square or circular in shape. Each of the loop coils 112 is connected through at least one capacitor 114. Thus, as shown in FIG. 9, the transmit coil arrangement 110 may be provided in combination with a patient table 120 with a movable loop coil 112 (e.g., pivoting relative to the patient table 120) above the patient table and the loop coil 112 (shown in FIG. 7) within the patient table 120 to define a Helmholtz coil pair.

Figure 10:
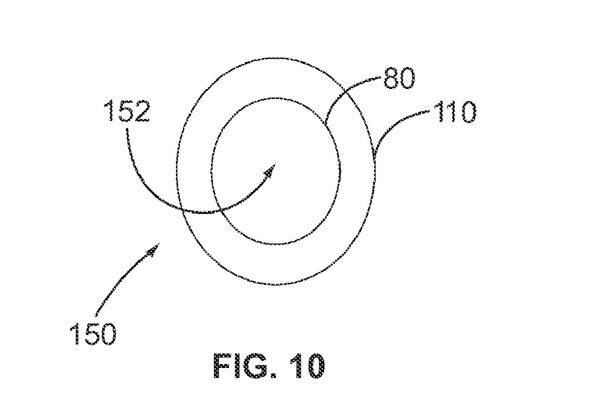
FIG. 10 is a side elevation view of an RF transmit and receive coil array formed in accordance with various embodiments.

Accordingly, as shown in FIG. 10, a transmit and receive RF coil arrangement 150 may be provided. Specifically, the RF coil array 80 configured as a receive RF coil is positioned concentrically within the transmit coil arrangement 110. An object or patient to be imaged is positioned within an opening 152 formed therethrough.

Figure 11:
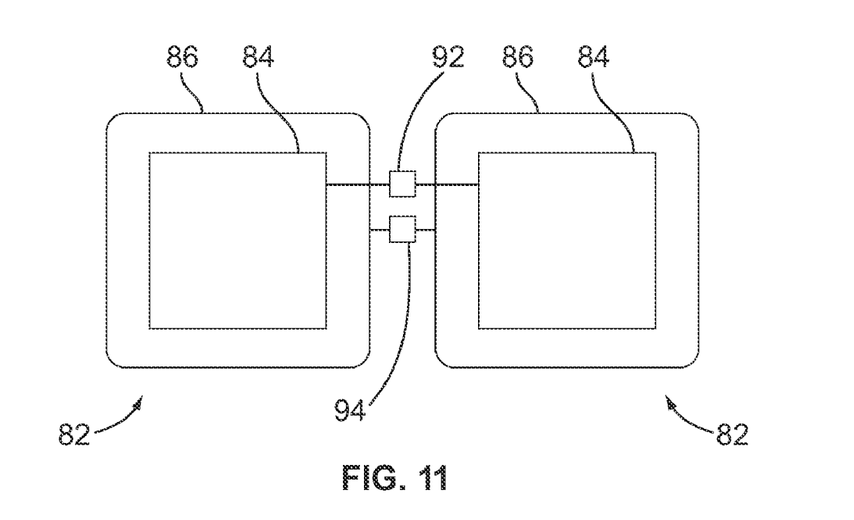
FIG. 11 is a simplified diagram of a pair of coil elements of a dual-frequency RF coil array with capacitive mesh decoupling formed in accordance with various embodiments.

Thus, the dual-frequency RF coil array 80 may be formed form a plurality of coil elements 82. In accordance with the various embodiments, two coil elements as shown in FIG. 11, each formed from a coil pair having an inner loop coil 84 and an outer loop coil 86 that are decoupled using capacitive meshes 92 and 94, respectively, may be used to form coil arrays of different sizes and configurations by adding coil elements 82 that are likewise decoupled with capacitive meshes (or optionally overlapping).

The coil pairs defined by the inner loop coil 84 and outer loop coil 86 are configured for dual-frequency use. For example, the coil elements 82 may be proton-carbon mesh pairs or carbon-proton mesh pairs having the inner loop coil 84 and outer loop coil 86 tuned to resonate at the Larmor frequency of carbon and proton and vice versa. It should be noted that when the inner loop coil 84 is tuned to resonate at the Larmor frequency of proton and the outer loop coil 86 is tuned to resonate at the Larmor frequency of carbon, a capacitive mesh is only provided between the outer loop coils 86 of adjacent coil elements 82.

Thus, doubly tuned (dual-frequency) coil elements are provided that form different sized and shaped arrays. It should be noted that when reference is made herein to an array, this refers to any arrangement having more than one coil element. The doubly tuned coil elements in various embodiments resonate at the Larmor frequency of different types of nuclei.

It should be noted that variations and modifications are contemplated. For example, a receive coil may be formed from a doubly tuned array as described herein and a transmit coil may be formed from a single tuned coil element. Moreover, different coil element configurations may be provided. For example, instead of the coil elements being positioned concentrically, the coil elements may be provided on top of each other. Additionally, a doubly tuned array formed in accordance with various embodiments may be configured for imaging different body parts or regions. For example, although the various embodiments are described in connection with a torso array, a dual frequency carbon-proton prostate endo-receiver coil array may be provided with all the circuitry localized in an insertable housing (e.g., an insertable pod).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A radio-frequency (RF) coil array for magnetic resonance imaging, the RF coil array comprising:
    a first coil element having a pair of dual-frequency loop coils concurrently operable at two different frequencies;
    a second coil element having a pair of dual-frequency loop coils concurrently operable at two different frequencies; and
    at least one capacitive mesh configured to decouple the pairs of dual-frequency loop coils of the first and second coil elements.

2. An RF coil array in accordance with claim 1 wherein the pair of dual-frequency loop coils comprise an inner loop coil and an outer loop coil, the inner loop being concentric with the outer loop.

3. An RF coil array in accordance with claim 2 wherein the at least one capacitive mesh is configured to decouple the inner loop coils of the first and second coil elements and the outer loop coils of the first and second coil elements.

4. An RF coil array in accordance with claim 2 wherein the inner loop coil is configured to be resonant at a Larmor frequency for carbon and the outer loop coil is configured to be resonant at a Larmor frequency for proton.

5. An RF coil array in accordance with claim 2 wherein the inner loop coil is configured to be resonant at a Larmor frequency for proton and the outer loop coil is configured to be resonant at a Larmor frequency for carbon.

6. An RF coil array in accordance with claim 1 wherein the pair of dual-frequency loop coils comprise an upper loop coil and a lower loop coil.

7. An RF coil array in accordance with claim 1 wherein the at least one capacitive mesh comprises a plurality of capacitors arranged as capacitive bridges.

8. An RF coil array in accordance with claim 1 wherein the first and second coil elements are configured for MRI signal receive operation.

9. An RF coil array in accordance with claim 1 further comprising third and fourth coil elements each having a pair of loop coils to form a torso imaging arrangement with the first and second coil elements.

10. An RF coil array in accordance with claim 1 wherein each pair of dual-frequency loop coils is configured to resonate at a Larmor frequency of protons and a Larmor frequency of $^{13}C$.

11. An RF coil array in accordance with claim 1 further comprising at least one preamplifier decoupled from one of the first coil element and the second coil element.

12. An RF coil array in accordance with claim 11 further comprising one of an LC trap and an impedance inverter providing the preamplifier decoupling.

13. An RF coil array in accordance with claim 1 wherein the pair of dual-frequency loop coils are non-overlapping.

14. An RF coil array in accordance with claim 1 wherein the capacitive mesh comprises:
    a first pair of capacitors coupled between a first inner loop in the first coil element and a second inner loop in the second coil element; and
    a second pair of capacitors coupled between a first outer loop in the first coil element and a second outer loop in the second coil element.

15. A method of providing dual-frequency magnetic resonance imaging, the method comprising:
    tuning first coil element having a first pair of dual-frequency loop coils such that the first pair of dual-frequency loop coils resonate at different frequencies;
    tuning a second coil element having a second pair of dual-frequency loop coils such that the second pair of dual-frequency loop coil resonate at different frequencies; and
    decoupling the first and second pairs of dual frequency loop coils using a capacitive mesh.

* * * * *